(12) United States Patent
Huang

(10) Patent No.: US 9,847,279 B2
(45) Date of Patent: Dec. 19, 2017

(54) COMPOSITE LEAD FRAME STRUCTURE

(71) Applicant: Chang Wah Technology CO., LTD., Kaohsiung (TW)

(72) Inventor: Chia-Neng Huang, Kaohsiung (TW)

(73) Assignee: CHANG WAH TECHNOLOGY CO., LTD., Kaohsiung (TW)

( * ) Notice: Subject to any disclaimer, the term of this patent is extended or adjusted under 35 U.S.C. 154(b) by 237 days.

(21) Appl. No.: 14/454,807

(22) Filed: Aug. 8, 2014

(65) Prior Publication Data
US 2016/0043019 A1 Feb. 11, 2016

(51) Int. Cl.
*H01L 23/495* (2006.01)
*H01L 23/498* (2006.01)

(52) U.S. Cl.
CPC .. *H01L 23/49513* (2013.01); *H01L 23/49517* (2013.01); *H01L 23/49534* (2013.01); *H01L 23/49861* (2013.01); *H01L 2224/48091* (2013.01); *H01L 2224/73265* (2013.01)

(58) Field of Classification Search
CPC ......... H01L 23/49517; H01L 23/49527; H01L 23/49822; H01L 23/49513; H01L 23/49861; H01L 23/49534; H01L 23/49524
See application file for complete search history.

(56) References Cited

U.S. PATENT DOCUMENTS

2010/0127363 A1* 5/2010 Nondhasitthichai .... H01L 24/06
257/673

\* cited by examiner

*Primary Examiner* — Thanhha Pham
(74) *Attorney, Agent, or Firm* — Jackson IPG PLLC; Demian K. Jackson

(57) ABSTRACT

The present invention relates to a structure of a composite lead frame generally having a die bonding layer and a solder layer and may further have an cohesive layer between the die bonding layer and the solder layer. The die bonding layer is made of flex substrate and the solder layer is made of traditional lead frame. Thus, the composite lead frame structure is suitable for the flip chip or wire bonding packaging process of LED and also suitable for semiconductor IC packaging process. It is good in electric and heat conductivity, and also with higher mechanical strength, resulting high pin counts and minimization of resulted IC.

9 Claims, 14 Drawing Sheets

COMPOSITE LEAD FRAME STRUCTURE

BACKGROUND OF THE INVENTION

Field of the Invention

The present invention relates to a lead frame structure, particularly a composite structure of flex substrate and lead frame suitable for the flip chip or wire bonding packaging process of LED and also semiconductor IC packaging process.

Brief Description of the Prior Art

A general flex substrate is made of copper foil and Polyimide, PI stacked together. Electric circuitry shall be formed by etching process and plating process to complete a flex substrate. Referring to FIG. 1 which shows an illustrative sectional view of a general flex substrate, the flex substrate 8 mainly comprises a flex base material 80, an upper metal layer 81 and an adhesive layer 82. A plating layer 83 is formed on top of the upper metal layer 81. During the manufacturing process of having an IC 84 eutectic using the flex substrate 8, a carrier (not show in the figure) must be used to enhance the mechanical strength of the flex substrate 8 and also improve the yield rate of IC packaging process. It is noted that the heat conductive coefficient of the flex base material 81 being approximately 0.1-0.35 W/mK which is very much lower than the heat conductive coefficient 398 W/mK of a copper metal lead frame.

A conventional lead frame is shown in FIG. 2 which is an illustrative sectional view of the same. The lead frame 9 comprises conductive leads 90 which having plating layers 91 formed on the upper and lower surfaces thereof. Because of the thickness of the lead frame 9 usually greater than the flex substrate, conductive leads space of lead frame greater than conductive lead space of the flex substrate, it results the number of the conductive leads of the lead frame 9 much less than the number of conductive leads of the flex substrate. Therefore, the dimension of resulted IC after packaging process becomes relatively large.

SUMMARY OF THE INVENTION

The principal objective of present invention is to provide a composite lead frame structure suitable for the flip chip or wire bonding packaging process of LED and also suitable for semiconductor IC packaging process.

The advantages of the composite lead frame according to the present invention are good in electric and heat conductivity, higher mechanical strength, resulting high pin counts and minimization of resulted IC.

There are several principle features according to the present invention. The first principal feature of one embodiment of the composite lead frame according to the present invention is to provide a composition of traditional lead frame and flex substrate used for flip chip or wire bonding packaging of LED or IC. The composite lead frame structure comprises a die bonding layer and a solder layer. A plurality of lead frame cells have lead frame cell gap in between one another. Each lead frame cell gap is provided with a first lead frame cell gap, a second lead frame cell gap and a third lead frame cell gap. The third lead frame cell gap is filled with insulating material. Lead frame cell has a die bonding unit and a solder unit. The die bonding unit comprises insulating clearance and a plurality of conductive leads and a plurality of conductive body holes. Each of the conductive leads of the die bonding unit sequentially contains upper metal layer, upper adhesive layer, tape layer and lower adhesive layer. The insulating clearance of die bonding unit comprises conductive lead clearance and tape clearance. The insulating clearance is formed between various conductive leads. The solder unit comprises a plurality of conductive leads and an insulating clearance which being formed between lead tips of conductive leads. The conductive leads of die bonding unit are vertically aligned with conductive leads of the solder unit and lower adhesive layer is also tightly attached with the conductive leads of the solder unit.

Another feature of one embodiment of the composite lead frame according to the present invention is to provide a composite lead frame in which the upper adhesive layer and lower adhesive layer are insulating paste. The conductive lead of the die bonding layer are made of copper foil. The plurality conductive leads of solder layer are made of copper, iron or aluminum. Upon the plurality of conductive lead of the die bonding unit, there is formed a plating layer which is a material of one selected from silver, gold, nickel, palladium and tin or combination thereof. The width of the insulating clearance of the die bonding unit can be greater, smaller or equal to the width of the insulating clearance of the solder unit. The plurality of conductive body holes are filled with either of gold, silver, copper and aluminum.

A second principal feature of one embodiment of a composite lead frame according to the present invention is to provide a composite lead frame which comprises a die bonding layer, a solder layer and a cohesive layer. Each of the conductive leads of the die bonding unit sequentially contains upper metal layer, upper adhesive layer and tape layer. The cohesive layer between the die bonding layer and the solder layer and the lead frame cell further have a cohesive unit between the die bonding unit and the solder unit.

Another feature of one embodiment of the composite lead frame according to the present invention is to provide a composite lead frame in which the cohesive unit can be a conductive paste that attached or joined together with die bonding unit and solder unit.

Another feature of one embodiment of the composite lead frame according to the present invention is to provide a composite lead frame in which the cohesive unit can comprises an upper cohesive unit under the conductive lead of the die bonding unit and a lower cohesive unit above the conductive leads of the solder unit. The cohesive unit consists of an upper cohesive unit and a lower cohesive unit made of eutectic material. Therefore, the attachment of die bonding unit and solder unit is made through the upper cohesive unit and lower cohesive unit of the cohesive unit formed with eutectic materials of gold, silver or tin and being joined together by eutectic process.

A third principle feature of one embodiment of the composite lead frame according to the present invention is to provide a composite lead frame in which the die bonding unit further comprises a die pad which comprises a plurality of heat conductive holes and also sequentially have an upper metal layer, an upper adhesive layer, a tape layer and a lower adhesive layer. The solder unit comprises a die pad and an insulating clearance which being formed between lead tips of conductive leads and the die pad. The conductive leads and die pad of the die bonding unit are vertically aligned with conductive leads and die pad of the solder unit and the lower adhesive layer being tightly attached with conductive leads and die pad of the solder unit.

Another feature of one embodiment of the composite lead frame according to the present invention is to provide a composite lead frame in which the die pad of the die bonding layer are made of copper foil. The die pad of the solder layer is made of copper, iron or aluminum. On top of the die pad of the die bonding unit, and also at the bottom of the die pad of the solder unit, there is formed a plating layer which is a material of one selected from silver, gold, nickel, palladium, and tin or combination thereof. The heat conductive holes are filled with gold, silver, copper or aluminum.

A fourth principal feature of one embodiment of the composite lead frame according to the present invention is to provide a lead frame which comprises a die bonding layer, a solder layer and a cohesive layer. Each conductive leads of the die bonding unit sequentially contain an upper metal layer, an upper adhesive layer and a tape layer. The cohesive layer between the die bonding layer and the solder layer and the lead frame cell further have a cohesive unit between the die bonding unit and the solder unit. The die pad further comprises a plurality of heat conductive holes and also sequentially has an upper metal layer, an upper adhesive layer, a tape layer and a lower adhesive layer. There are insulating clearance formed between lead tip of conductive lead and die pad. And the solder unit further comprises a die pad, an insulating clearance which being formed between the lead tips of the conductive leads and die pad. The conductive leads and the die pad of the die bonding unit are vertically aligned with conductive leads and die pad of the solder unit and the lower adhesive layer is tightly attached with conductive leads and die pad of the solder unit.

Another feature of one embodiment of the composite lead frame according to the present invention is to provide a composite lead frame in which the cohesive unit can be a conductive paste that attached to joined together with die bonding unit and solder unit.

Another feature of one embodiment of the composite lead frame according to the present invention is to provide a composite lead frame in which the cohesive unit can comprises an upper cohesive unit under the conductive lead of the die bonding unit and a lower cohesive unit above the conductive leads of the solder unit. The cohesive unit consists of an upper cohesive unit and a lower cohesive unit made of eutectic material. Therefore, the attachment of die bonding unit and solder unit is made through the upper cohesive unit and lower cohesive unit of the cohesive unit formed with eutectic materials of gold, silver or tin and being joined together by eutectic process.

Another principle feature of one embodiment of the composite lead frame according to the present invention is to provide a composite lead frame in which the die pad of the die bonding layer are made of copper foil. The die pad of the solder layer is made of copper, iron or aluminum. On top of the die bonding unit, and also at the bottom of the solder unit, there is formed a plating layer which is a material of one selected from silver, gold, nickel, palladium, and tin or combination thereof. The heat conductive holes are filled with gold, silver, copper or aluminum.

A fifth principle feature of one embodiment of the composite lead frame according to the present invention is to provide a composite lead frame in which the number of the plurality of conductive lead and of die bonding unit and solder unit being greater than two. There will be a insulating space consists of conductive lead space and a tape space formed between the conductive lead of the die bonding unit. There is another insulating space formed between the conductive lead of the solder unit. These insulating space of the solder unit are filled with insulating material.

With aforementioned features of the composite lead frame according to the present invention, the advantages become apparent and can be summarized as below. 1. The die bonding unit comprises insulating clearance and a plurality of conductive leads and a plurality of conductive body holes. Therefore, the composite lead frame of the invention has very good electric conductivity. 2. A die pad of the solder layer is provided with heat conductive holes to communicate with die bonding layer resulting good heat conductivity. 3. Insulating materials are filled with filled within the insulating clearance and insulating gaps of the solder layer. Therefore, the composite lead frame has a high mechanical strength. 4. All the insulating gaps and insulating clearance are very thin in their dimension. Therefore the composite lead frame according to the present invention can be used as one of high pin counts achieving the minimization of resulted IC.

BRIEF DESCRIPTION OF THE DRAWINGS

The objectives, effectiveness, characteristics and structures of the present invention will become more fully understood from the detailed description given below by way of embodiments with reference to the accompanying drawings, wherein.

DETAILED DESCRIPTION OF PREFERRED EMBODIMENTS

Figure 1:
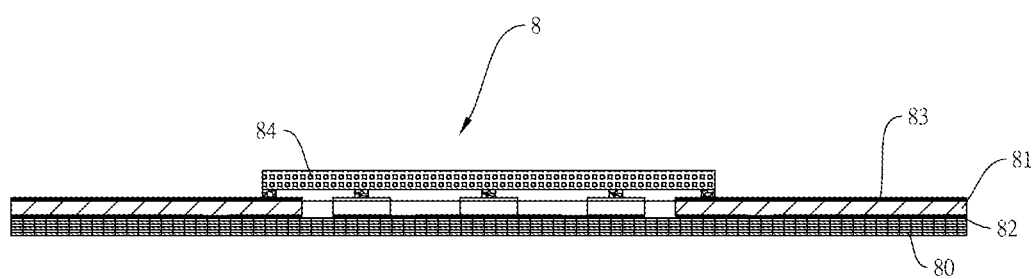
FIG. 1 shows an illustrative sectional view of a conventional flex substrate.
Figure 2:
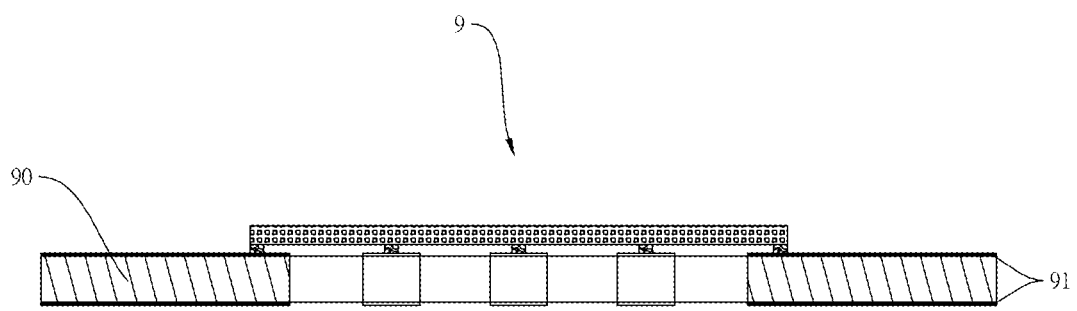
FIG. 2 shows an illustrative sectional view of a conventional copper metal lead frame.
Figure 3:
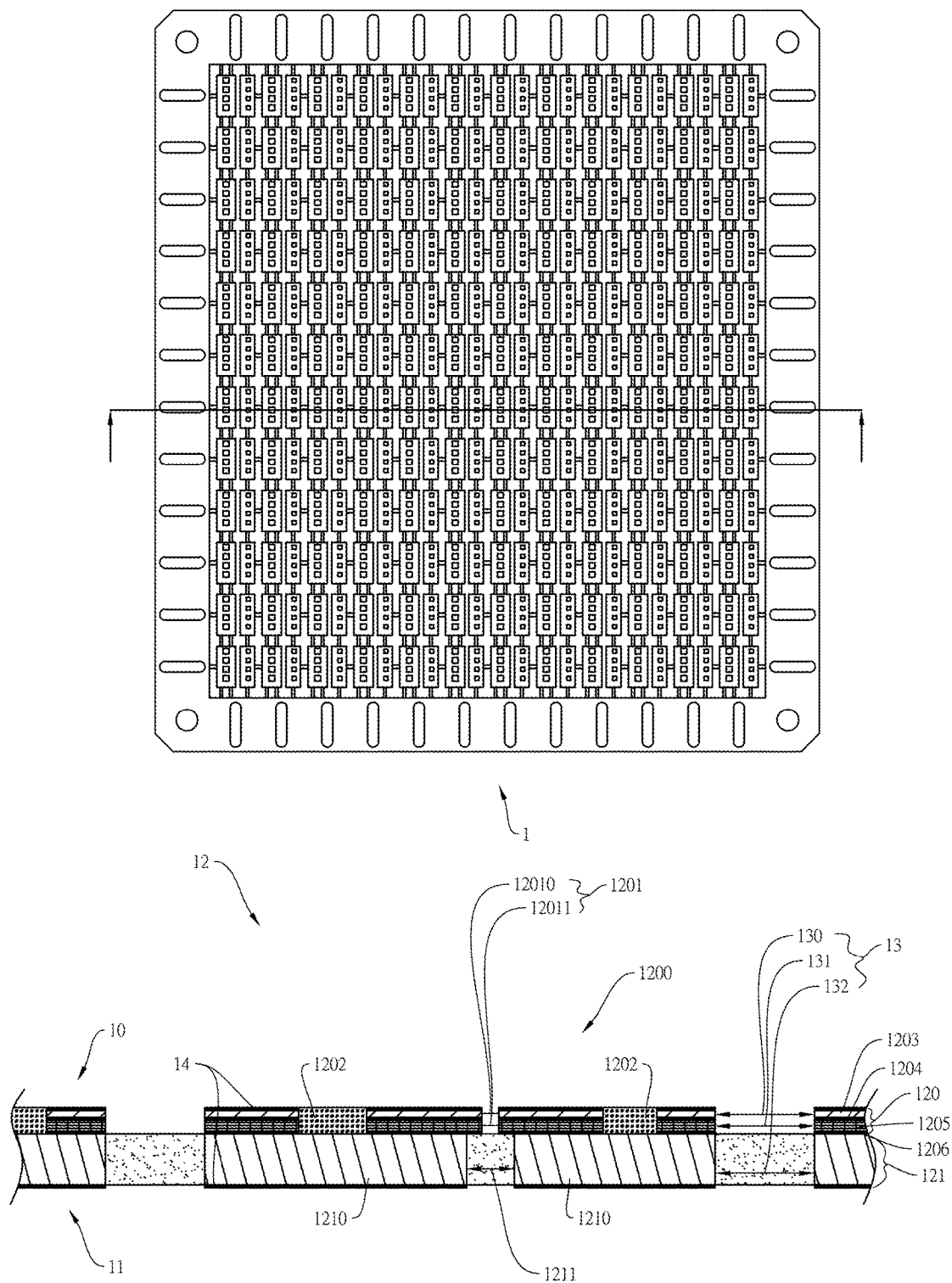
FIG. 3 shows a plan and sectional view of a first embodiment of a composite lead frame according to the present invention used for flip chip packaging of a LED.
Figure 4:
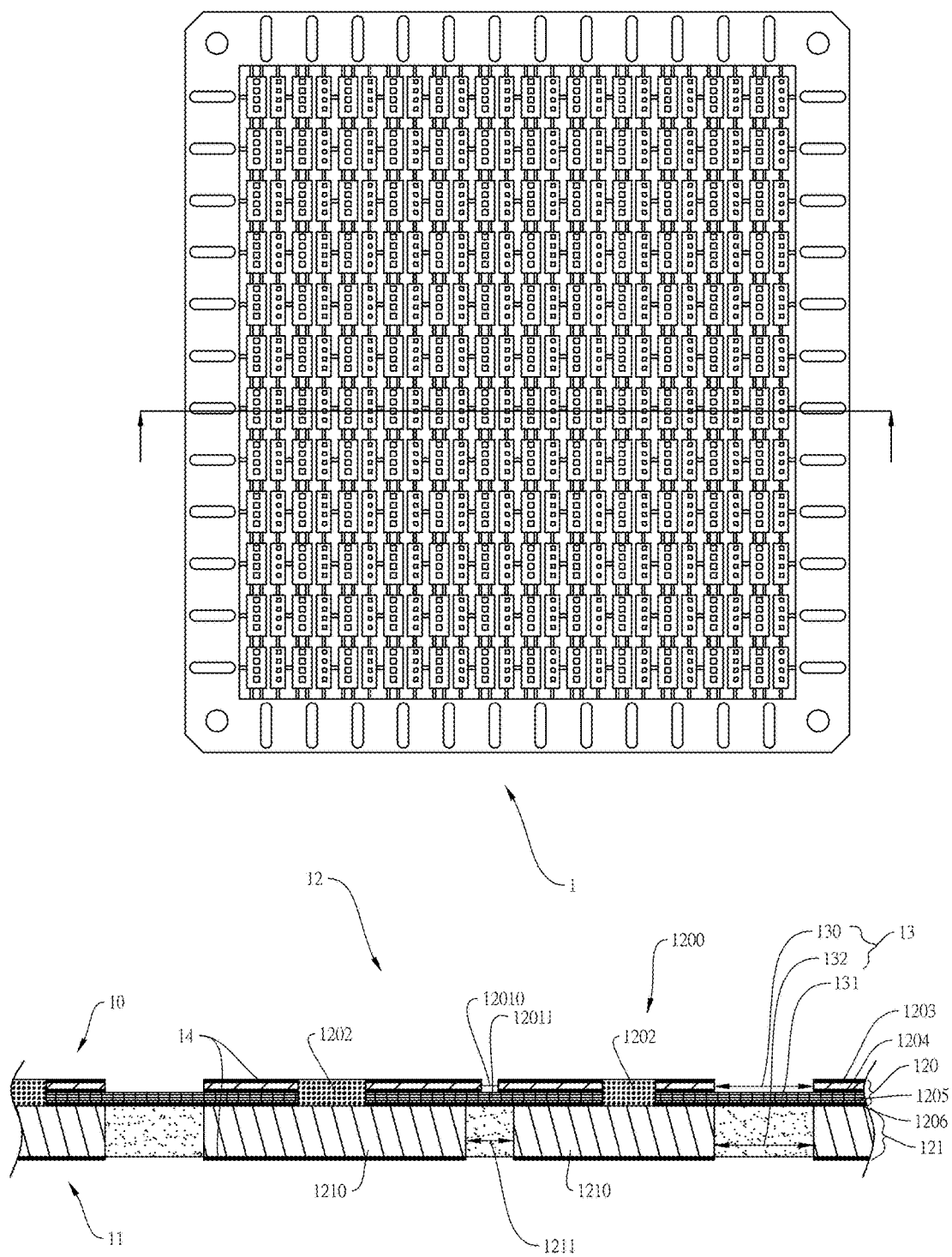
FIG. 4 shows another plan and sectional view of a first embodiment of a composite lead frame according to the present invention used for flip chip packaging of a LED.

Referring to FIG. 3 and FIG. 4 conjunctively which show a plan and sectional view of a first embodiment of composite lead frame according to the present invention used for flip chip packaging of a LED, the composite lead frame structure 1 comprises a die bonding layer 10 and a solder layer 11.

The overall composite lead frame structure 1 consists of a plurality of lead frame cells 12 with lead frame cell gap 13 in between one another. Each lead frame cell gap 13 is provided with a first lead frame cell gap 130, a second lead frame cell gap 131 and a third lead frame cell gap 132. The third lead frame cell gap 132 is filled with insulating material. Lead frame cell 12 has die bonding unit 120 and a solder unit 121. The die bonding unit 120 comprises insulating clearance 1201 and a plurality of first conductive leads 1200 and a plurality of conductive body holes 1202. Each of the first conductive leads 1200 sequentially contains upper metal layer 1203, upper adhesive layer 1204, tape layer 1205 and lower adhesive layer 1206. The insulating clearance 1201 of die bonding unit 120 comprises conductive lead clearance 12010 and tape clearance 12011. The insulating clearance 1201 is formed between various conductive lead tips.

The solder unit 121 comprises insulating clearance 1211 and a plurality of second conductive leads 1210. The insulating clearance 1211 of the solder unit 121 filled with insulating material. The insulating clearance 1211 is formed between various conductive lead tips. The first conductive lead 1200 and the second conductive lead 1210 are vertically aligned so that the lower adhesive layer 1206 of the die bonding unit 120 is tightly attached with solder unit 121.

The upper adhesive layer 1204 and lower adhesive layer 1206 are insulating paste. The upper metal layer 1203 of the die bonding layer 10 are made of copper foil. The plurality second conductive leads 1210 of solder layer 11 are made of copper, iron or aluminum. Upon the plurality of first conductive lead 1200, there is formed a plating layer 14 which is a material of one selected from silver, gold, nickel, palladium and tin or combination thereof. The width of the insulating clearance 1201 of the die bonding unit 120 can be greater, smaller or equal to the width of the insulating clearance 1211 of the solder unit 121. The plurality of conductive body holes 1202 are filled with either of gold, silver, copper and aluminum.

As particularly shown in FIG. 4, the tape layer 1205 is made of Polyimide, PI. The second lead frame cell gap 131 and conductive lead clearance 12010 are also made of Polyimide, PI.

Figure 5:
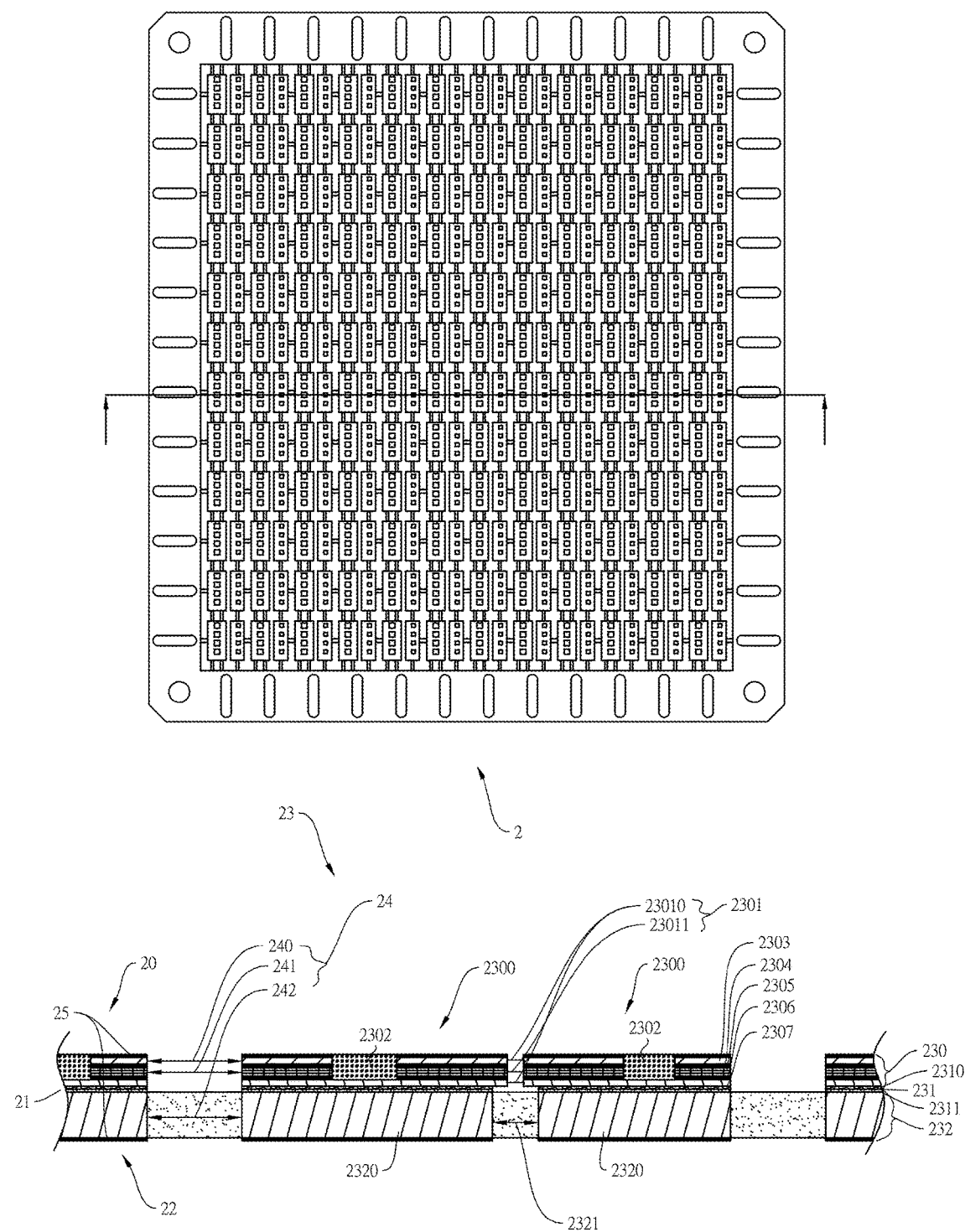
FIG. 5 shows a plan and sectional view of a second embodiment of a composite lead frame according to the present invention used for flip chip packaging of a LED.

Referring to FIG. 5 which shows a plan and sectional view of a second embodiment of a composite lead frame according to the present invention used for flip chip packaging of a LED, with reference to FIG. 4 of the first embodiment, the die bonding layer is a double layered metal layer. It can be seen the composite lead frame structure 2 consists of die bonding layer 20, cohesive layer 21 and solder layer 22.

The overall composite lead frame structure 2 consists of a plurality of lead frame cells 23 with lead frame cell gap 24 in between one another. Each lead frame cell gap 24 is provided with a first lead frame cell gap 240, a second lead frame cell gap 241 and a third lead frame cell gap 242. The third lead frame cell gap 242 is filled with insulating material.

Lead frame cell 23 has die bonding unit 230, a cohesive unit 231 and a solder unit 232. The die bonding unit 230 comprises a plurality of first conductive leads 2300 and insulating clearance 2301 and the first conductive leads 2300 comprises a plurality of conductive body holes 2302. Each of the first conductive leads 2300 sequentially contains upper metal layer 2303, upper adhesive layer 2304, tape layer 2305, lower adhesive layer 2306 and lower metal layer 2307. The insulating clearance 2301 of the die bonding unit 230 comprises conductive lead clearance 23010 and tape clearance 23011. The insulating clearance 2301 is formed between various conductive lead tips.

The solder unit 232 comprises insulating clearance 2321 and a plurality of second conductive leads 2320. The insulating clearance 2321 of the solder unit 232 filled with insulating material. The insulating clearance 2321 is formed between various conductive lead tips.

The first conductive leads 2300 and the second conductive leads 2320 are vertically aligned so that the die bonding unit 230 is tightly attached with the solder unit 232. The cohesive unit 231 can be a conductive paste which further comprises an upper cohesive unit 2310 under the first conductive leads 2300 and a lower cohesive unit 2311 above the second conductive leads 2320. The cohesive unit 231 consists of the upper cohesive unit 2310 and lower cohesive unit 2311 made of eutectic material. Therefore, the attachment of die bonding unit 230 and solder unit 232 is through the upper cohesive unit 2310 and lower cohesive unit 2311 of the cohesive unit 231 formed with eutectic materials of gold, silver or tin and being joined together by eutectic process.

The upper adhesive layer 2304 and lower adhesive layer 2306 are insulating paste. The upper metal layer 2303 and upper adhesive layer 2304 of the die bonding layer 20 are made of copper foil. A plurality of second conductive leads 2320 of solder layer 22 are made of copper, iron or aluminum. Upon a plurality of first conductive leads 2300, and also below the plurality of second conductive leads 2300, there is formed a plating layer 25 which is a material of one selected from silver, gold, nickel, palladium and tin or combination thereof. The width of the insulating clearance 2301 of the die bonding unit 230 can be greater, smaller or equal to the width of the insulating clearance 2321 of the solder unit 232. There are plurality of conductive body holes 2302 filled with either of gold, silver, copper and aluminum.

As the same particularly shown in FIG. 5, the tape layer 2305 is made of Polyimide, PI. The second lead frame cell gap 241 and insulating clearance 23011 are also made of Polyimide, PI.

Figure 6:
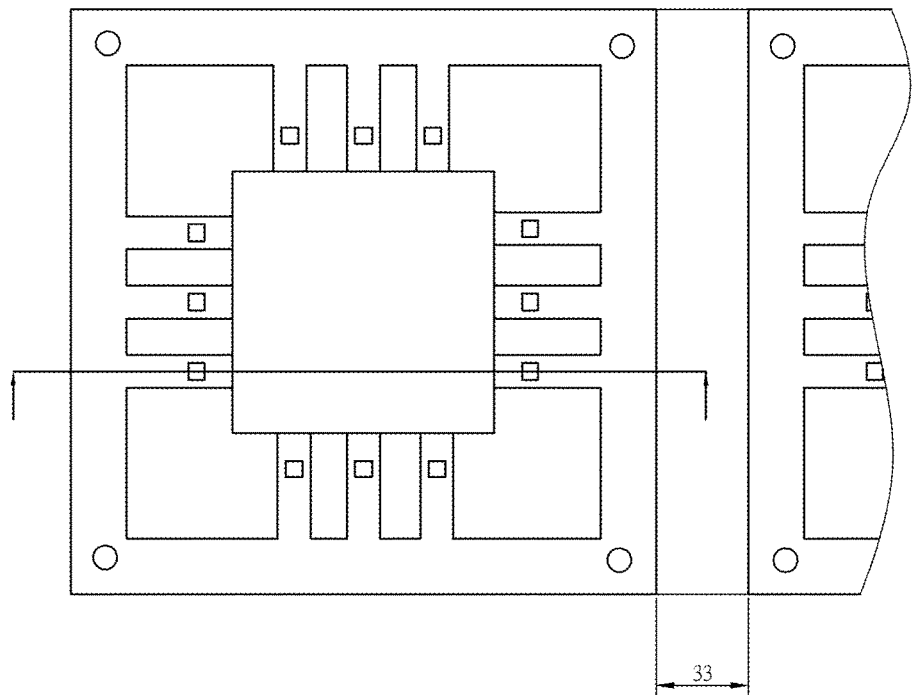
FIG. 6 shows a plan and sectional view of a third embodiment of a composite lead frame according to the present invention used for IC packaging.
Figure 6:
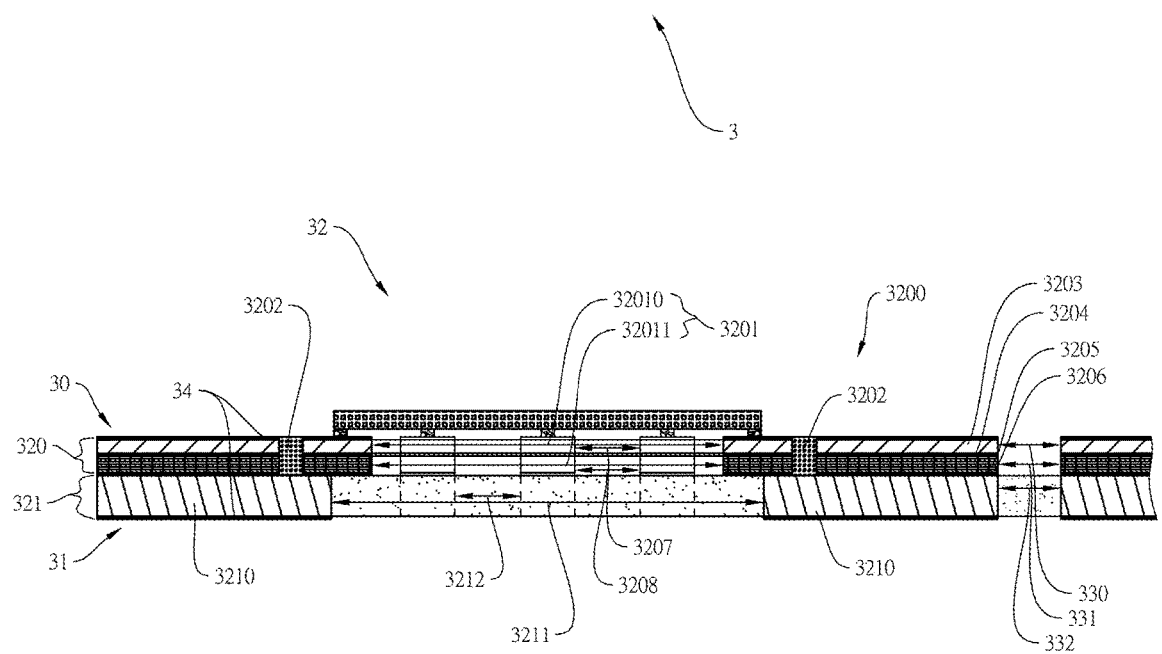
Figure 7:
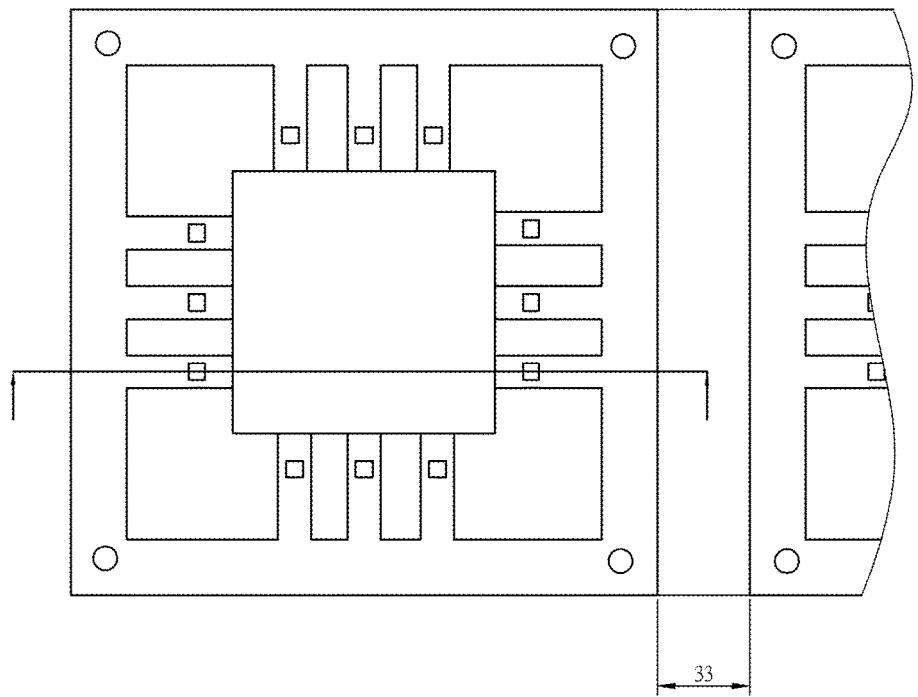
FIG. 7 shows another plan and sectional view of the third embodiment of a composite lead frame according to the present invention used for IC packaging.
Figure 7:
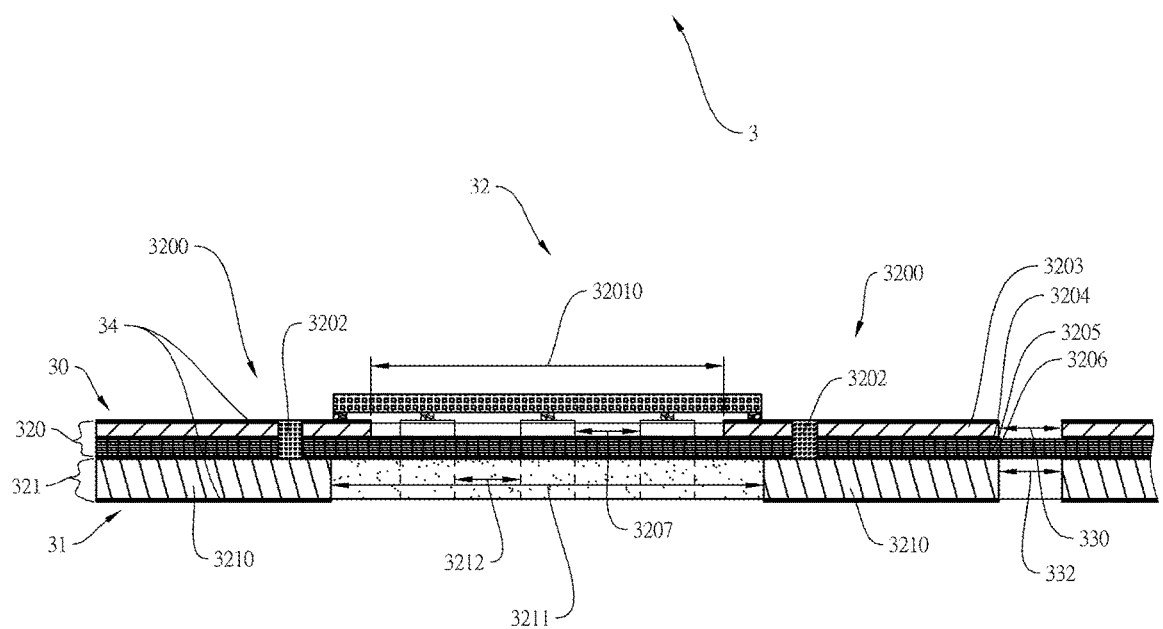

Referring to FIGS. 6 and 7 conjunctively which shows a composite lead frame structure used for IC packaging, the composite lead frame structure 1 comprises a die bonding layer 30 and a solder layer 31.

The overall composite lead frame structure 1 consists of a plurality of lead frame cells 32 with lead frame cell gap 33 in between one another. Each lead frame cell gap 33 is provided with a first lead frame cell gap 330, a second lead frame cell gap 331 and a third lead frame cell gap 332. The third lead frame cell gap 332 is filled with insulating material.

Lead frame cell 32 has die bonding unit 320 and a solder unit 321. The die bonding unit 320 comprises insulating clearance 3201 and a plurality of first conductive leads 3200 and the first conductive leads 3200 comprises a plurality of conductive body holes 3202. Each of the first conductive leads 3200 sequentially contains upper metal layer 3203, upper adhesive layer 3204, tape layer 3205 and lower adhesive layer 3206. The insulating clearance 3201 of the die bonding unit 320 comprises conductive lead clearance 32010 and tape clearance 32011. The insulating clearance 3201 is formed between various conductive lead tips The solder unit 321 comprises insulating clearance 3211 and a plurality of second conductive leads 3210. The insulating clearance 3211 of the solder unit 321 filled with insulating material.

The insulating clearance 3211 of the solder unit 321 is formed between various conductive leads. The first conductive lead 3200 and the second conductive lead 3210 are vertically aligned so that the lower adhesive layer 3206 of the die bonding unit 320 is tightly attached with solder unit 321.

The upper adhesive layer 3204 and lower adhesive layer 3206 are insulating paste. The upper metal layer 3203 is made of copper foil. The plurality conductive leads 3210 of the solder layer 31 are made of copper, iron or aluminum. Upon the plurality of first conductive leads 3200, and also below the plurality of second conductive leads 3210, there is formed a plating layer 34 which is a material of one selected from silver, gold, nickel, palladium, and tin or combination thereof. The width of the insulating clearance 3201 of the die bonding unit 320 can be greater, smaller or equal to the width of the insulating clearance 3211 of the solder unit 321. The plurality of conductive body holes 3202 are filled with either of gold, silver, copper and aluminum.

It is to be noted and according to the structure of this embodiment the number of plurality first conductive leads 3200 and second conductive leads 3210 is greater than two. There will be a conductive lead space 3207 and a tape space 3208 formed between the first conductive leads 3200. There is another insulating space 3212 between the second conductive leads 3210. This insulating space 3212 is filled with insulating material.

Figure 8:
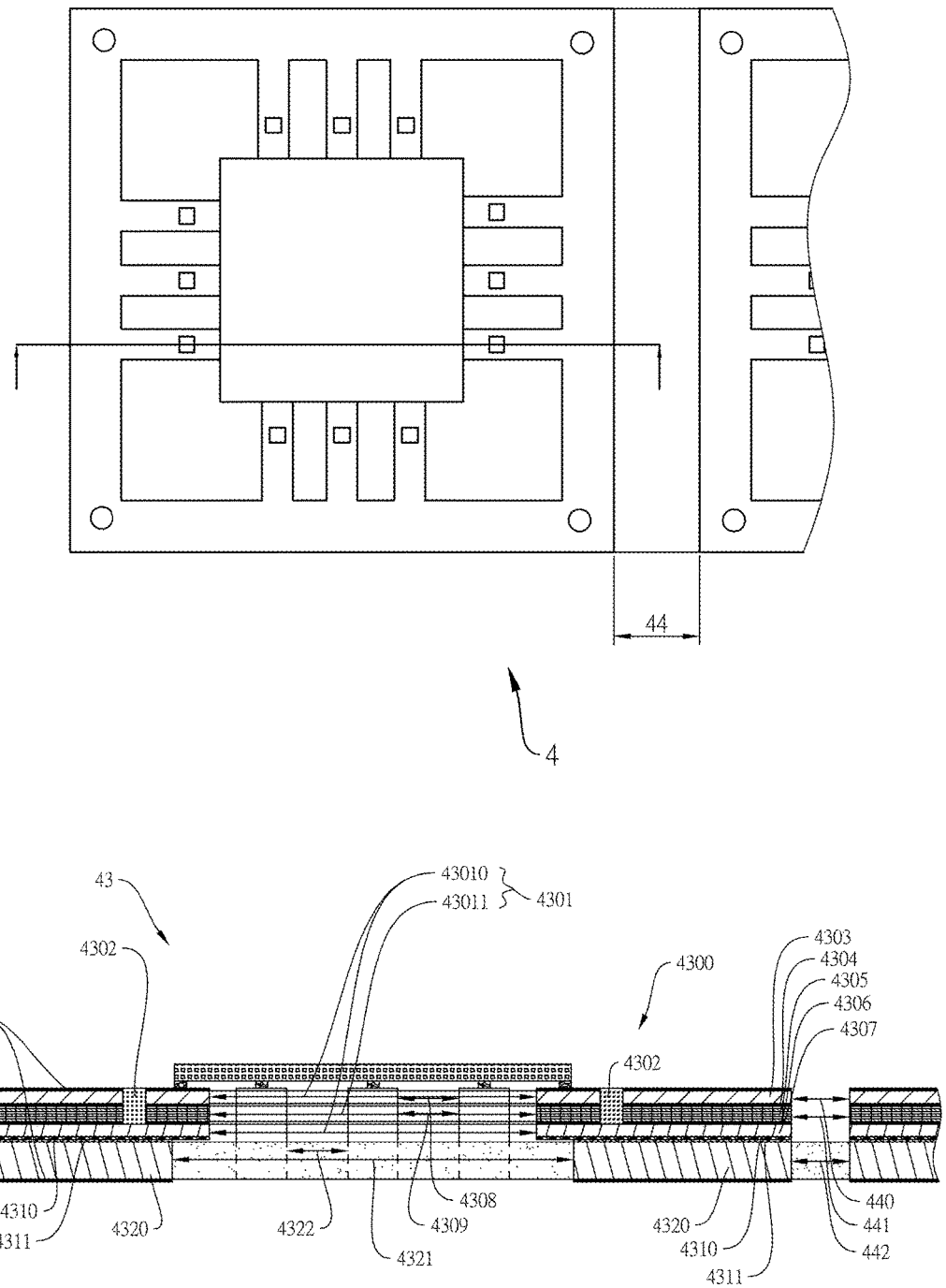
FIG. 8 shows a plan and sectional view of a fourth embodiment of a composite lead frame according to the present invention used for IC packaging.

As particularly shown in FIG. 7, the tape layer 3205 is made of Polyimide, PI. The second lead frame cell gap 331 and insulating clearance 32011 are also made of Polyimide, PI Referring to FIG. 8 which shows a plan and sectional view of a fourth embodiment of a composite lead frame according to the present invention used for IC packaging process, and also referring to FIG. 7 conjunctively, it can be seen the composite lead frame structure 4 consists of die bonding layer 40, cohesive layer 41 and solder layer 42.

The overall composite lead frame structure 4 consists of a plurality of lead frame cells 43 with lead frame cell gap 44 in between one another. Each lead frame cell gap 44 is provided with a first lead frame cell gap 440, a second lead frame cell gap 441 and a third lead frame cell gap 442. The third lead frame cell gap 442 is filled with insulating material.

Lead frame cell 43 has die bonding unit 430, a cohesive unit 431 and a solder unit 432. The die bonding unit 430 comprises first insulating clearance 4301 and a plurality of first conductive leads 4300 and the first conductive leads 4300 comprises a plurality of conductive body hole 4302. Each of the first conductive leads 4300 of the die bonding unit 430 sequentially contains upper metal layer 4303, upper adhesive layer 4304, tape layer 4305, lower adhesive layer 4306 and lower metal layer 4307. The first insulating clearance 4301 of the die bonding unit 430 comprises conductive lead clearance 43010 and tape clearance 43011. The first insulating clearance 4301 is formed between various conductive lead tips.

The solder unit 432 comprises second insulating clearance 4321 and a plurality of second conductive leads 4320. The second insulating clearance 4321 of the solder unit 432 filled with insulating material. The second insulating clearance 4321 is formed between various conductive lead tips.

The first conductive lead 4300 of die bonding unit 430 and the second conductive lead 4320 of solder unit 432 are vertically aligned so that the die bonding unit 430 is tightly attached with solder unit 432. The cohesive unit 431 is formed between the die bonding unit 430 and solder unit 432. The cohesive unit 431 can be a conductive paste which further comprises an upper cohesive unit 4310 under the first conductive lead 4300 of the die bonding unit 430 and a lower cohesive unit 4311 above the second conductive lead 4320 of the solder unit 232. The cohesive unit 431 consists of the upper cohesive unit 4310 and lower cohesive unit 4311 made of eutectic material. Therefore, the attachment of die bonding unit 430 and solder unit 432 is through the upper cohesive unit 4310 and lower cohesive unit 4311 of the cohesive unit 431 formed with eutectic materials of gold, silver or tin and being joined together by eutectic process.

The upper adhesive layer 4304 and lower adhesive layer 4306 are insulating adhesive. The upper metal layer 4303 and lower metal layer 4307 of the die bonding layer 40 are made of copper foil. A plurality second conductive leads 4320 of the solder layer 42 are made of copper, iron or aluminum. Upon the plurality of first conductive leads 4300 of the die bonding unit 430, and also below the plurality of second conductive leads 4320 of the solder unit 432, there is formed a plating layer 45 which is a material of one selected from either of silver, gold, nickel, palladium and tin or combination thereof. The width of the first insulating clearance 4301 of the die bonding unit 430 can be greater, smaller or equal to the width of the second insulating clearance 4321 of the solder unit 432. There are plurality of conductive body holes 2302 filled with either of gold, silver, copper and aluminum.

It is to be noted and according to the structure of this embodiment that while the number of plurality first conductive leads 4300 and 4320 of die bonding unit 430 and solder unit 432 is greater than two, there will be an conductive lead space 4308 and a tape space 4309 between the first conductive leads 4300. There is another insulating space 4322 between the second conductive leads 4320 of the solder unit 432. This insulating space 4322 is filled with insulating material.

The tape layer 4305 is made of Polyimide, PI. The tape space 4309, the second lead frame cell gap 441 and tape clearance 43011 are applied with Polyimide PI. This is equivalent to the tape space 3208, second lead frame cell gap 331 and tape clearance 32011 are applied with Polyimide PI as shown particularly shown in FIG. 6.

Figure 9:
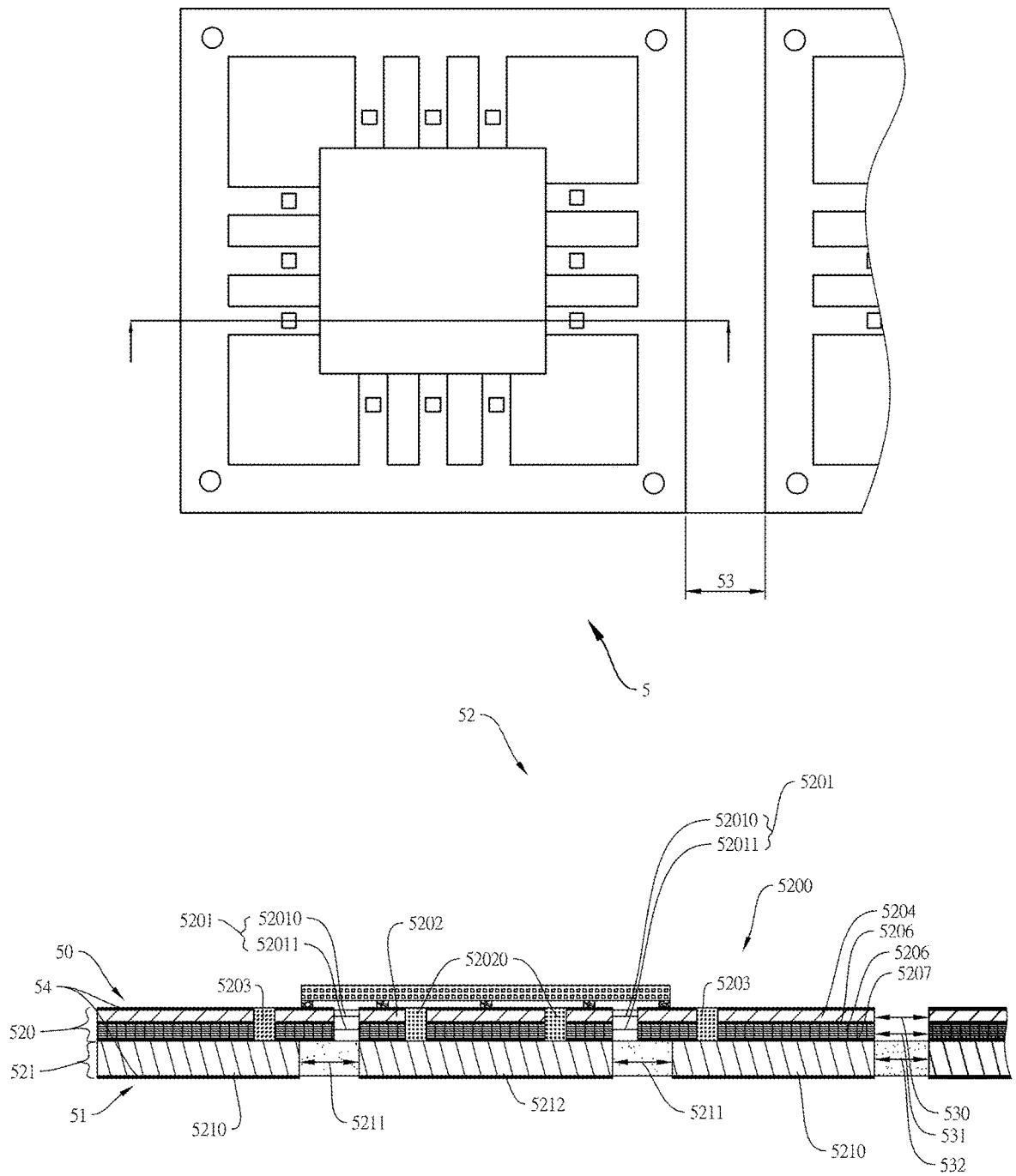
FIG. 9 shows an illustrative and sectional view of a fifth embodiment of a composite lead frame according to the present invention suitable to be used for IC packaging.
Figure 10:
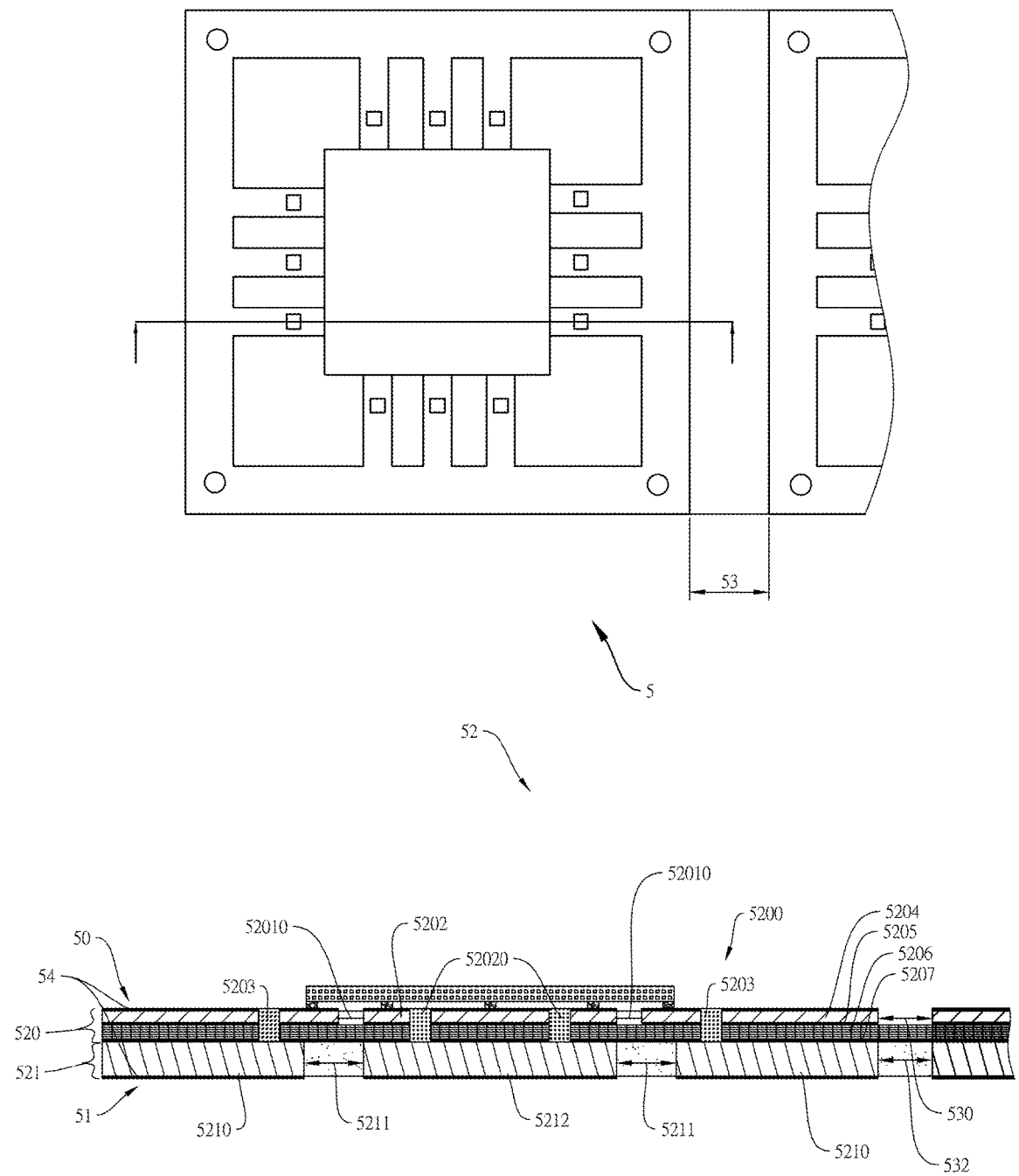
FIG. 10 shows another illustrative and sectional view of the fifth embodiment of a composite lead frame according to the present invention suitable for used in IC packaging.
Figure 11:
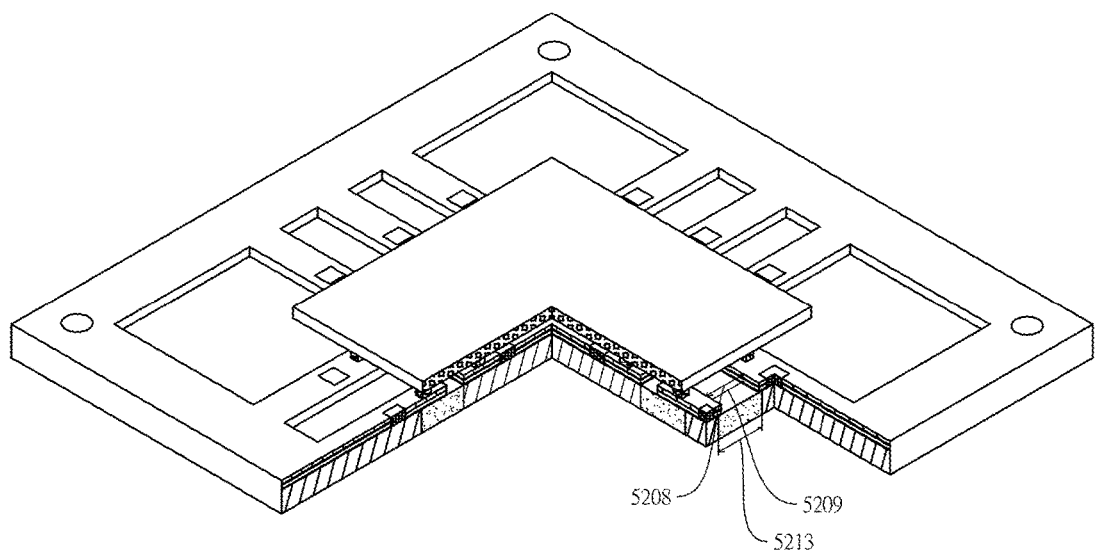
FIG. 11 is a perspective sectional view of the fifth embodiment of a composite lead frame according to the present invention showing tape layer.

Referring to FIGS. 9 to 11 which show illustrative and sectional views of a fifth embodiment of a composite lead frame according to the present invention, the composite lead frame structure 5 comprises a die bonding layer 50 and a solder layer 51. This embodiment specifically includes a die pad in the die bonding unit and solder unit. There exists only one metal layer.

The overall composite lead frame structure 5 consists of a plurality of lead frame cells 52 with lead frame cell gap 53 in between one another. Each lead frame cell gap 53 is provided with a first lead frame cell gap 530, a second lead frame cell gap 531 and a third lead frame cell gap 532. The third lead frame cell gap 532 is filled with insulating material.

Lead frame cell 52 has die bonding unit 520 and a solder unit 521. The die bonding unit 520 comprises a plurality of first conductive leads 5200, first insulating clearance 5201, a first die pad 5202 and also a plurality of conductive body holes 5203. The first die pad 5202 of the die bonding unit 520 has a plurality of heat conductive holes 52020. Each of the first conductive leads 5200 and first die pad 5202 of the die bonding unit 520 sequentially contains upper metal layer 5204, upper adhesive layer 5205, tape layer 5206 and lower adhesive layer 5207. The first insulating clearance 5201 of the die bonding unit 520 comprises conductive lead clearance 52010 and tape clearance 52011. The first insulating clearance 5201 of the die bonding unit 520 is formed between first die pad 5202 and various first conductive lead 5200.

The solder unit 521 has second insulating clearance 5211 filled with insulating material. The second insulating clearance 5211 is formed between second die pad 5212 and various conductive lead tips. The first conductive lead 5200 of die bonding unit 520, the second conductive lead 5210 of solder unit 521, the first die pad 5202 of die bonding unit 520 and first die pad 5202 of solder unit 521 are vertically aligned so that the lower adhesive layer 5207 of the die bonding unit 520 is tightly attached with solder unit 521.

The upper adhesive layer 5204 and lower adhesive layer 5206 are insulation paste. The upper metal layer 5204 and also the first die pad 5202 are made of copper foil. The plurality second conductive leads 5210 of the solder layer 51 and second die pad 5212 are made of copper, iron or aluminum. Above the plurality of first conductive lead 5200 of the die bonding unit 520 and the first die pad 5202, there is formed a electro plating layer 54. Also below the plurality of first conductive leads 5200 and first die pad 5202, there is formed an electro plating layer 54 which is a material of one selected from either of silver, gold, nickel, palladium and tin or combination thereof. The width of the first insulating clearance 5201 of the die bonding unit 520 can be less than, greater or equal to the width of the second insulating clearance 5211 of the solder unit 521. A plurality of heat conductive holes 52020 are filled with either of gold, silver, copper and aluminum.

It is to be noted and according to the structure of this embodiment, the number of plurality first conductive lead 5200 and 5210 of die bonding unit 520 and solder unit 521 may be greater than two. There will be an conductive lead space 5208 and a tape space 5209 between the first conductive leads 5200. There is another insulating space 5213 between the second conductive lead 5201 of the solder unit 521. This insulating space 5213 is filled with insulating material which is best shown in FIG. 11.

As shown in FIG. 10, the tape layer 5205 is made of Polyimide, PI. The second lead frame cell gap 531, the tape space 5209 and tape clearance 52011 are also made of Polyimide PI.

Figure 12:
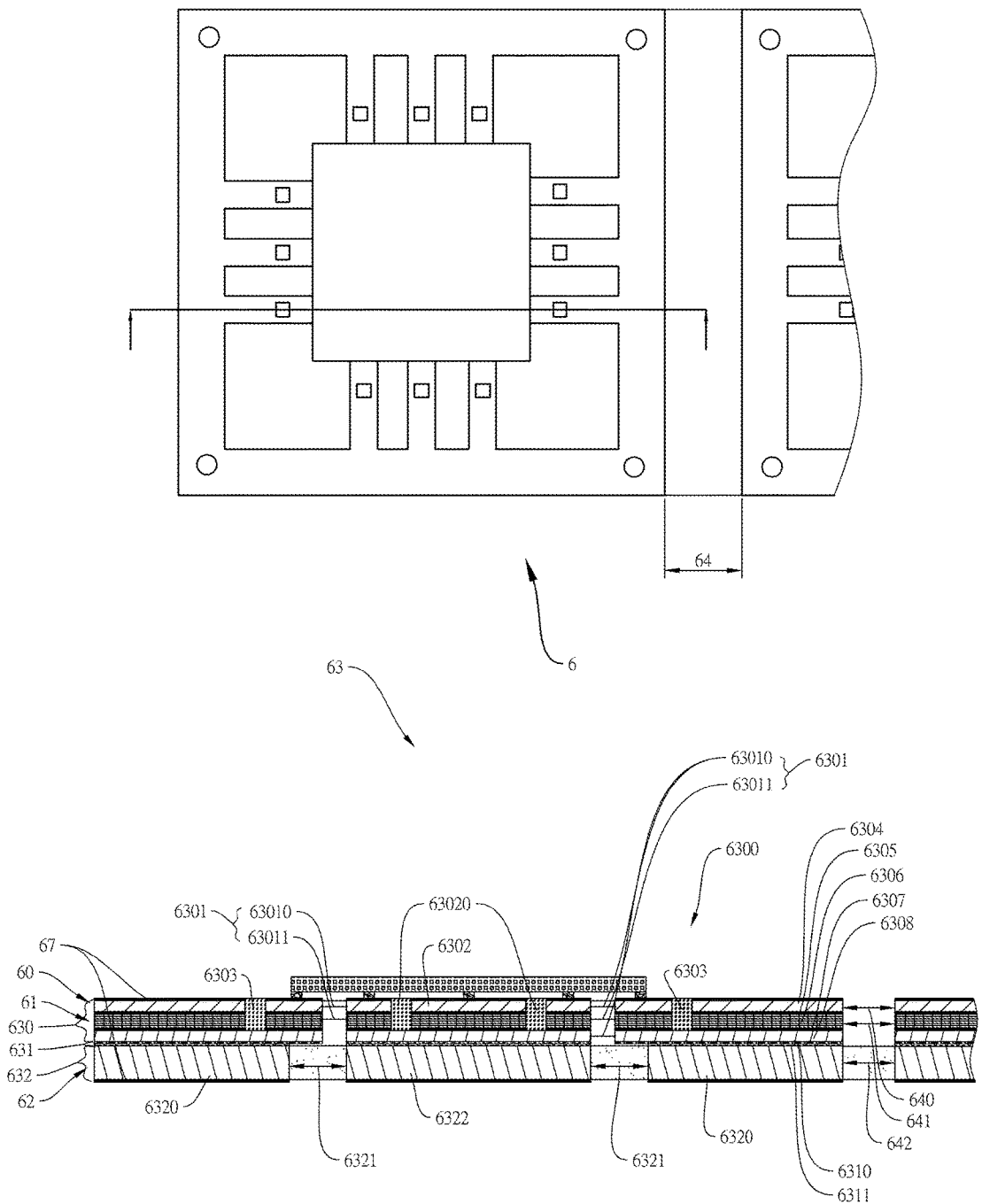
FIG. 12 is an illustrative and sectional view of a sixth embodiment of the composite lead frame according to the present invention suitable for IC packaging.
Figure 13:
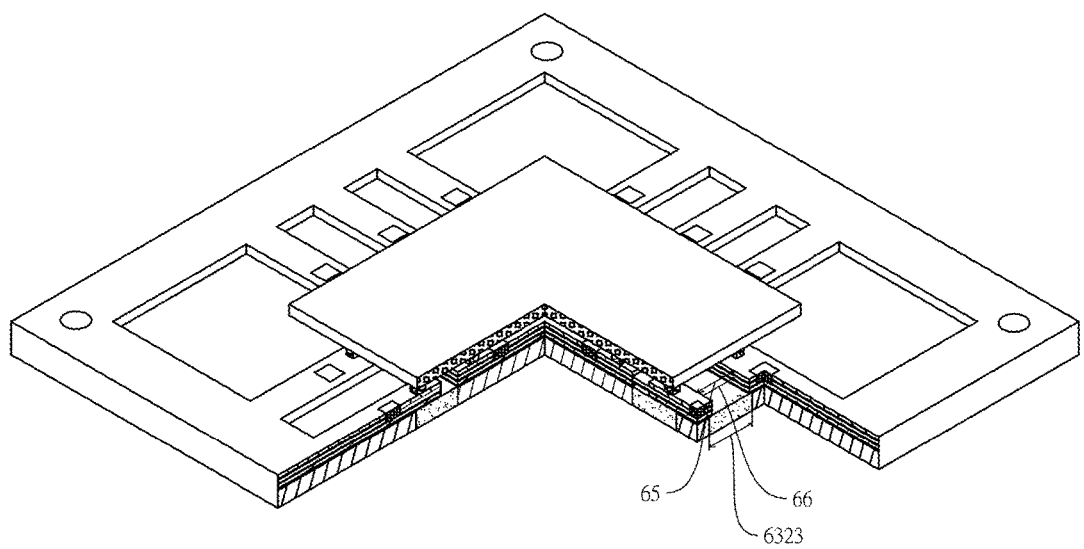
FIG. 13 is a perspective sectional view of the sixth embodiment of the composite lead frame according to the present invention as shown in FIG. 12.

Referring to FIGS. 12 and 13 which show illustrative and sectional views of a sixth embodiment of a composite lead frame according to the present invention, the lead frame structure specifically includes a die pad in the die bonding unit and cohesive unit and there exists two metal layers contrast to the fifth embodiment which only has one metal layer. The overall composite lead frame structure 6 comprises a die bonding layer 60, an adhesive layer 61 and a solder layer 51.

The overall composite lead frame structure 6 consists of a plurality of lead frame cells 63 with lead frame cell gap 64 in between one another. Each lead frame cell gap 64 is provided with a first lead frame cell gap 640, a second lead frame cell gap 641 and a third lead frame cell gap 642. The third lead frame cell gap 642 is filled with insulating material.

Lead frame cell 63 has die bonding unit 630, a cohesive unit 631 and a solder unit 632. The die bonding unit 630 comprises a plurality of first conductive leads 6300, first insulating clearance 6301 and a first die pad 6302 and also a plurality of conductive body holes 6303. The first die pad 6302 of the die bonding unit 630 has a plurality of heat conductive holes 63020. Each of the first conductive leads 6300 and first die pad 6302 of the die bonding unit 630 sequentially contains upper metal layer 6304, upper adhesive layer 6305, tape layer 6306, lower adhesive layer 6307 and lower metal layer 6308. The first insulating clearance 6301 of the die bonding unit 630 comprises conductive lead clearance 63010 and tape clearance 63011. The first insulating clearance 6301 of the die bonding unit 630 is formed between first die pad 6302 and various first conductive leads 6300.

The solder unit 632 has a plurality of second insulating clearance 6321 filled with insulating material, a plurality of second conductive lead 6320 and a second die pad 6322. The second die pad 6322 is arranged in between second conductive lead 6320. An second insulating clearance 6321 is formed between second die pad 6322 and various second conductive lead 6320. The cohesive unit 631 is between die bonding unit 630 and solder unit 632. The first conductive leads 6300 of die bonding unit 630, the second conductive lead 6320 of solder unit 632, the first die pad 6302 of die bonding unit 630 and second die pad 6322 of solder unit 632 are vertically aligned so that the die bonding unit 630 is combined with the solder unit 632.

The upper adhesive layer 6305 and lower adhesive layer 6307 are insulating paste. The upper metal layer 6304 and lower metal layer 6308 of the die bonding layer 60 and also the first die pad 6302 are made of copper foil. The plurality second conductive lead 6320 of the solder layer 62 and second die pad 6322 are made of copper, iron or aluminum. Above the plurality of first conductive leads 6300 of the die bonding unit 630 and the first die pad 6302, there is formed a plating layer 67. Also below the plurality of conductive leads 6320 and second die pad 6322, there is formed a plating layer 67 which is a material of one selected from either of silver, gold, nickel, palladium and tin or combination thereof. The width of the first insulating clearance 6301 of the die bonding unit 630 can be greater, smaller or equal to the width of the second insulating clearance 6321 of the solder unit 632. A plurality of conductive body holes 6303 are filled with either of gold, silver, copper and aluminum. A plurality of heat conductive holes 63020 are filled with either of gold, silver, copper and aluminum.

It is to be noted and according to the structure of this embodiment that while the number of plurality first conductive leads 6300 and 6320 of die bonding unit 630 and solder unit 632 is greater than two, there will be formed an conductive lead space 65 and a tape space 66 between the first conductive leads 6300. There is another insulating space 6323 between the second conductive lead 6320 of the solder unit 632. This insulating space 6323 is filled with insulating material which is best shown in FIG. 13.

As shown in FIG. 10, the tape layer 6306 is made of Polyimide, PI. The second lead frame cell gap 641, the tape space 66 and tape clearance 63011 are also made of Polyimide, PI.

Figure 14:
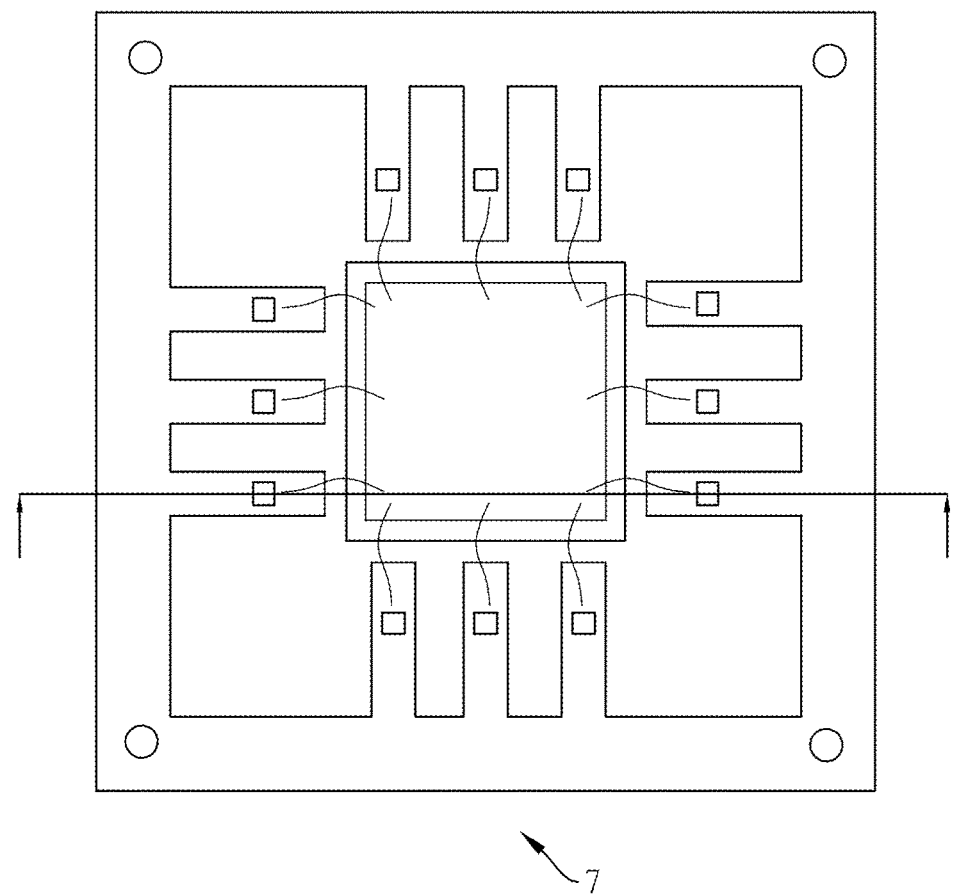
FIG. 14 is an illustrative and sectional view of a seventh embodiment of a composite lead frame according to the present invention used for IC wire bonding.
Figure 14:
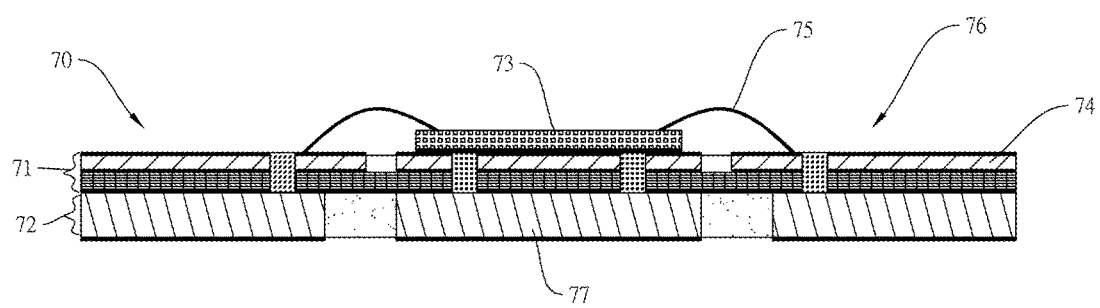

Referring to FIG. 14 which shows an illustrative and sectional view of a seventh embodiment of a composite lead frame according to the present invention used for IC wire bonding, it can be seen that the die bonding layer 70 is a single face metal layer 74. There is a die pad 77 provided in the die bonding unit 71 and solder unit 72. For an IC chip 73 to be wire bonded, metal wires 75 shall be used to connect between electric circuitry. Of course, this application of the composite lead frame can also adopt the structure with double faces metal layer.

The present invention has been described herein above with preferred embodiments. It is noted still further changes and/or improvements can be made without departing from the spirit of the invention and the scope of defined in the Claims.

What is claimed is:

1. A composite lead frame structure having a die bonding layer and a solder layer, comprising a plurality of lead frame cells with lead frame cell gaps formed in between, each of said lead frame cell gaps comprising a first lead frame cell gap, a second lead frame cell gap and a third lead frame cell gap, said third lead frame cell gap being filled with insulating material, each of said lead frame cells further comprising a die bonding unit and a solder unit, wherein said die bonding unit comprises a plurality of first conductive leads and a first insulating clearance, each of said first conductive leads having a conductive body hole formed therein and also sequentially having an upper metal layer, an upper adhesive layer, a tape layer and a lower adhesive layer formed therein, said first insulating clearance being formed between each of lead tips of said first conductive leads forming a conductive lead clearance and a tape clearance;

said solder unit comprises a plurality of second conductive leads and a second insulating clearance;

said first conductive leads being vertically aligned with said second conductive leads; and said lower adhesive layer unit being tightly attached with said second conductive leads.

2. A composite lead frame structure as claimed in claim 1 wherein upon the number of said first conductive leads of said die bonding unit and said second conductive leads of said solder unit being greater than two, said first conductive leads having a conductive lead space between said first conductive leads, said second conductive leads also having insulating space which being filled with insulating material.

3. A composite lead frame structure as claimed in claim 1 wherein upon the number of said first conductive leads of said die bonding unit and said second conductive lead of said solder unit being greater than two, said first conductive leads having a conductive lead space and a tape space between said first conductive leads, said second conductive leads also having insulating space which being filled with insulating material.

4. A composite lead frame structure as claimed in claim 1 wherein said upper adhesive layer and said lower adhesive layer are insulating paste.

5. A composite lead frame structure as claimed in claim 1 wherein said upper metal layer is made of copper foil and said plurality of second conductive leads is made of copper, iron or aluminum.

6. A composite lead frame structure as claimed in claim 1 wherein upper portion of said first conductive leads and lower portion of said second conductive leads further comprise a plating layer respectively, said plating layer is made of one selected from either of silver, gold, nickel, palladium and tin or combination thereof.

7. A composite lead frame structure as claimed in claim 1 wherein the width of said first insulating clearance is greater, equal or smaller than the same of said second insulating clearance.

8. A composite lead frame structure as claimed in claim 1 wherein said conductive body holes are filled with gold, silver, copper or aluminum.

9. A composite lead frame structure as claimed in claim 1 wherein said second lead frame cell gap and said tape clearance are applied with Polyimide, PI.

* * * * *